United States Patent [19]

Wakamatsu

[11] 3,916,080

[45] Oct. 28, 1975

[54] ELECTRONIC CIRCUITRY CONTAINMENT DEVICE

[75] Inventor: Hisato Wakamatsu, Toyota, Japan

[73] Assignee: Nippon Soken, Inc., Nishio, Japan

[22] Filed: Mar. 21, 1974

[21] Appl. No.: 453,535

[30] Foreign Application Priority Data

Mar. 24, 1973 Japan .......................... 48-35924[U]

[52] U.S. Cl. ........ 174/17.05; 174/17 GF; 174/52 S; 317/101 A

[51] Int. Cl.$^{2}$ ........................................... H05K 5/06

[58] Field of Search ......... 174/17 GF, 17 CT, 17 R, 174/17.05, 17.08, 52 S; 317/101 A; 357/78, 75

[56] References Cited

UNITED STATES PATENTS

| | | | |
|---|---|---|---|
| 2,503,429 | 4/1950 | Ziegler | 174/17.08 |
| 2,810,889 | 10/1957 | Lundgren | 174/17 GF |
| 3,059,158 | 10/1962 | Doucette | 357/78 |
| 3,259,814 | 6/1966 | Green | 357/78 |
| 3,368,023 | 2/1968 | Dimock | 174/52 S |
| 3,401,314 | 9/1968 | Steele | 174/52 S |
| 3,500,440 | 3/1970 | Hastings | 174/52 S |
| 3,582,762 | 6/1971 | Mori et al. | 357/75 |
| 3,761,858 | 9/1973 | Oka | 338/174 X |

*Primary Examiner*—J. V. Truhe
*Assistant Examiner*—David A. Tone
*Attorney, Agent, or Firm*—Cushman, Darby & Cushman

[57] ABSTRACT

An electronic circuitry comprising MOS integrated circuits is hermetically encased in a container and it is connected with external electrodes through an electrode lead-out terminal, after which an inert gas is introduced into the hermetically sealed container. This construction enables the electronic circuitry to operate with a high degree of reliability against sudden changes in the ambient conditions.

6 Claims, 3 Drawing Figures

ELECTRONIC CIRCUITRY CONTAINMENT DEVICE

BACKGROUND OF THE INVENTION

1. Field of the Invention

The present invention relates to an electronic circuitry containment device which enables an electronic circuitry comprising MOS integrated circuits to perform the desired function when it is installed in a vehicle, e.g., automobile at a place where it is exposed to severe changes in the ambient conditions.

2. Description of the Prior Art

In the past, when installing an electronic circuitry comprising integrated circuits in a vehicle, it has been customary to use an electronic circuitry comprising bipolar integrated circuits so as to provide a low impedance circuitry in consideration of the desired operational stability against changes in the ambient conditions. These bipolar integrated circuits as well as other circuit elements are assembled on a printed board, encased in a container having vent holes and installed in the vehicle at a suitable place where there are less changes in the ambient conditions.

However, as for example, when it is desired to provide a digital electronic control for the automatic transmission system of a vehicle, the required control functions of the electronic circuitry tend to become very extensive and complicated and thus it is difficult to construct the electronic circuitry with bipolar integrated circuits. In other words, there is a drawback that if the control circuit in the electronic circuitry for the automatic transmission system is composed of DTL circuits (diode - transistor logic integrated circuits), the power consumption of this digital control circuit amounts to 1 ampere with the supply voltage of 6 volts. When this is added to the power consummed by the voltage regulator and the power transistor circuit, the power consumption amounts to 20 watts with the vehicle power supply of 12 volts. There are other problems such as the temperature rise in the control circuits. Thus, it is impossible to install in a vehicle the required control circuits for five to 10 different systems.

SUMMARY OF THE INVENTION

With a view to overcoming the foregoing difficulty, it is an object of this invention to provide a useful electronic circuitry containment device wherein an electronic circuitry comprising high impedance, low power consumption MOS integrated circuits is hermetically encased, along with an inert gas, in a sealed container from which the external electrodes of the electronic circuitry are brought out through an electrode lead-out element, whereby the electronic circuitry comprising the MOS integrated circuits is enabled to perform the desired function under operating conditions where it is subjected to severe changes in the ambient conditions, thereby enabling the digital control of various systems with a considerably reduced power consumption and hence the digitalization of various controls in automotive vehicles.

In accordance with this invention, an electronic circuitry containment device is provided which comprises an electronic circuitry including MOS integrated circuits, a container for hermetically encasing the electronic circuitry, and an electrode lead-out element through which external electrodes connected to the electronic circuitry are brought out and in which the hermetically sealed container is filled with an inert gas.

A great advantage of the device of this invention is that the limitations on the ambient conditions such as the abrupt ambient temperature changes may be considerably be relaxed for the hermetically sealed container as compared with those specified for the MOS integrated circuits, and therefore the electronic circuitry comprising the MOS integrated circuits may be installed and operated to perform the desired function with a high degree of reliability under conditions where it is subjected to severe changes in the ambient conditions.

DESCRIPTION OF THE PREFERRED EMBODIMENT

The present invention will now be described in greater detail with reference to the illustrated embodiment.

Figure 1:
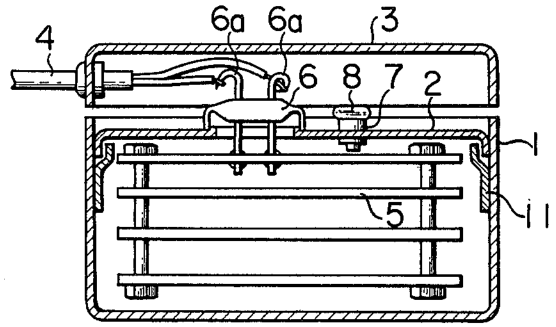
FIG. 1 is a sectional view showing an embodiment of an electronic circuitry containment device according to this invention.
Figure 2:
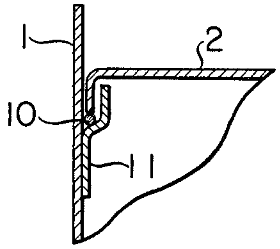
FIG. 2 is a partial sectional view showing the joint between the container and the sealing cap in the device of FIG. 1.
Figure 3:
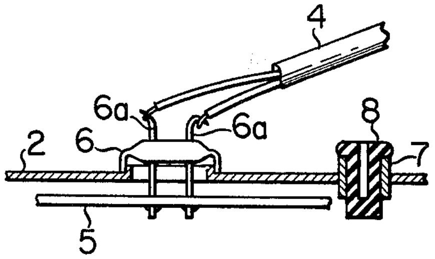
FIG. 3 is a partial sectional view of the sealing cap in the device of FIG. 1.

Referring now to FIG. 1 illustrating a sectional view of an embodiment of an electronic circuitry containment device of this invention, numeral 1 designates an open type container, 2 a sealing cap which is connected to the container 1 by connecting means shown in FIG. 2. In FIG. 2, numeral 10 designates a solder, 11 a support welded to the container 1 for supporting the sealing cap 2 before it is soldered to the container 1. The solder 10 is placed between the support 11 and the container 1 so that when it is heated and melted with the edge of the sealing cap 2 supported by the support 11, the container 1 and the sealing cap 2 are joined to form a sealed container. Numeral 3 designates a cover, 4 a lead wire, 5 an electronic circuitry having MOS integrated circuits, 6 an electrode lead-out element such as a hermetic sealing element which is soldered to a portion of the sealing cap 2 and through which external electrodes 6*a* electrically connected to the electronic circuitry 5 are brought out. The external electrodes 6*a* are electrically insulated from the sealing cap 2. Numeral 7 designates a metallic pipe mounted to extend through the sealing cap 2 and soldered thereto, 8 a rubber plug pressed into the metallic pipe 7 whose section is shown in FIG. 3. The sealed container is exhausted through the rubber plug 8, and an inert gas is also introduced into the sealed container through the rubber plug 8.

The electronic circuitry 5 having MOS integrated circuits is hermetically encased in the following manner. The electrode lead-out element 6 and the metallic pipe 7 are preliminarily soldered to the sealing cap 2 and the electronic circuitry 5 is also preliminarily secured by screws to the sealing cap 2. The electronic circuitry 5 is electrically connected to the external electrodes 6*a* on the electrode lead-out element 6. Thereafter, the electronic circuitry 5 is placed in the container 1 in such a manner that the edge of the sealing cap 2 is carried, along with the solder 10, by the support 11 of the container 1. In this condition, the portion including the support 11 is heated to join the sealing cap 2 and the container 1 with the solder 10. This completes the formation of the hermetically sealed container. The rubber plug 8 is then pressed into the metallic pipe 7 and a needle is inserted into the rubber plug 8 to exhaust the hermetically sealed container after which an inert gas is supplied thereinto. The action of this inert gas prevents the MOS integrated circuits of the electronic circuitry 5 from being affected by changes in the ambient conditions of the hermetically sealed container.

In other words, when, for example, the ambient temperature changes suddenly, the adhesion of moisture on the surface of the MOS integrated circuits may be prevented, resulting in preventing the leakage of current and enabling the circuits to perform the desired functions.

Further, the rubber plug 8 also functions as a safety valve when the container internal pressure rises abnormally.

It has been found that with a control circuit for an automatic automobile transmission system composed of a P-MOS IC type large-scale integrated electronic circuit and hermetically encased according to the teachings of the present invention, the power consumption was the product of the supply voltage of 6V and the consumption current of 7 mA, and therefore the power consumption was reduced to 1/100 as compared with that of a conventional electronic circuitry comprising DTL circuits. Further, the circuit was free from erroneous operations due to the adhesion of moisture and it could operate with a high degree of reliability. With this device, prior to the injection of inert gas, the container was exhausted to keep the internal pressure at 10 mmHg and the container was filled with nitrogen gas until the gas pressure attained 1.5 Kg/cm$^2$. As a result, when the device was installed at detrimental locations such as the engine room, under the floor or in the trunk of the vehicle, the electronic circuitry could operate reliably as desired.

I claim:

1. An electronic circuitry containment device comprising:

an electronic circuitry including high impedance integrated circuits;

a container having an open side;

a closing lid fitted to the open side of said container to cooperate therewith to define therewith a hermetically closed space encased by walls;

said electronic circuitry being disposed in said space and having terminals;

a hole provided in at least one of the walls encasing said space;

a flexible safety valve member normally closing and resiliently sealing said hole;

a member on at least one of said walls, through which said terminals of said electronic circuitry extends outwardly from said closed space;

said closed space being filled with an inert gas.

2. A device according to claim 1, wherein said safety valve member comprises a rubber plug which is inserted into said hole;

said safety valve being operative to release the inert gas when an abnormally high pressure is built up in the closed space.

3. A device according to claim 1, wherein said member through which said terminals of said electronic circuitry extends, comprises a hermetic sealing element.

4. A device according to claim 1, wherein said integrated circuits comprise MOS integrated circuits.

5. A device according to claim 1, wherein said electronic circuitry comprises an assembly of various control circuits.

6. An electronic circuitry containment device comprising:

a container having an open side;

a closing lid fitted to the open side of the container to cooperate therewith to define a hermetically closed space;

an electronic circuitry disposed in said closed space and having high impedance integrated circuits and terminals;

a hole provided in at least one of walls encasing said space;

a flexible safety valve member hermetrically closing and resiliently sealing said hole;

a member on at least one of said walls, through which said terminals of said electronic circuitry extends outwardly from said closed space;

said closed space being filled with an inert gas;

said safety valve member being operative to release the inert gas when an abnormally high pressure is built up in the said space.

* * * * *